(12) United States Patent
Ueno et al.

(10) Patent No.: US 12,127,377 B2
(45) Date of Patent: Oct. 22, 2024

(54) ELECTRONIC CONTROL DEVICE

(71) Applicant: Hitachi Astemo, Ltd., Hitachinaka (JP)

(72) Inventors: Keiko Ueno, Hitachinaka (JP); Yoshio Kawai, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 195 days.

(21) Appl. No.: 17/918,985

(22) PCT Filed: Feb. 2, 2021

(86) PCT No.: PCT/JP2021/003650
§ 371 (c)(1),
(2) Date: Oct. 14, 2022

(87) PCT Pub. No.: WO2021/220570
PCT Pub. Date: Nov. 4, 2021

(65) Prior Publication Data
US 2023/0292470 A1    Sep. 14, 2023

(30) Foreign Application Priority Data

Apr. 28, 2020    (JP) ................................ 2020-078870

(51) Int. Cl.
*G06F 1/16*    (2006.01)
*H05K 5/00*    (2006.01)
(Continued)

(52) U.S. Cl.
CPC ................................ *H05K 7/20409* (2013.01)

(58) Field of Classification Search
CPC ........... H05K 7/20409; H05K 7/20418; H05K 7/20427; H05K 7/2039; H05K 7/20436;
(Continued)

(56) References Cited

U.S. PATENT DOCUMENTS 6,488,126 B1 * 12/2002 Yamakawa ........... B66B 11/024
187/391
8,189,331 B2 * 5/2012 Senatori .................. G06F 1/203
165/104.34
(Continued)

FOREIGN PATENT DOCUMENTS

CN        109196967 A      1/2019
JP        2000-223876 A    8/2000
(Continued)

OTHER PUBLICATIONS

Chinese-language Office Action issued in Chinese Application No. 202180029225.8 dated Mar. 6, 2024 with English translation (12 pages).
(Continued)

*Primary Examiner* — Anthony M Haughton
(74) *Attorney, Agent, or Firm* — Crowell & Moring LLP

(57) ABSTRACT

An electronic control device capable of improving cooling performance by air cooling is provided.
The electronic control device includes a circuit board 6 (board), a heat-generating component 7 (heating element) mounted on the circuit board 6, a heat dissipation material 12 (thermally conductive material) that is in contact with the heat-generating component 7 and conducts heat of the heat-generating component 7, a fin-integrated housing 3 (housing) that is in contact with the heat dissipation material 12 and covers the circuit board 6, and a cover 1 that covers the fin-integrated housing 3. The cover 1 has a hole (2) 8 and a hole (3) 9 as intake holes, and a hole (1) 2 as an exhaust hole. The hole (1) 2 is formed at a position close to the heat-generating component 7 relative to the hole (2) 8 and the hole (3) 9. The hole (2) 8 and the hole (3) 9 are formed at positions away from the heat-generating component 7 relative to the hole (1) 2.

15 Claims, 8 Drawing Sheets

(51) Int. Cl.
*H05K 7/00* (2006.01)
*H05K 7/20* (2006.01)

(58) Field of Classification Search
CPC .. H05K 7/20445; H05K 7/20454; G06F 1/20; G06F 1/203; G06F 1/206
See application file for complete search history.

(56) References Cited

U.S. PATENT DOCUMENTS

| | | | | |
|---|---|---|---|---|
| 8,228,671 | B2* | 7/2012 | Ikeda | H05K 7/20145 |
| | | | | 257/722 |
| 8,711,561 | B2* | 4/2014 | Matsumoto | H01L 23/467 |
| | | | | 361/695 |
| 8,837,140 | B2* | 9/2014 | Zurowski | H05K 7/20154 |
| | | | | 361/691 |
| 9,600,042 | B2* | 3/2017 | Tsunoda | H05K 7/20163 |
| 10,838,469 | B2* | 11/2020 | Saravis | H05K 7/20172 |
| 11,262,819 | B2* | 3/2022 | Kuo | H05K 7/20172 |
| 2011/0108250 | A1* | 5/2011 | Horng | H01L 23/427 |
| | | | | 165/121 |
| 2012/0057296 | A1* | 3/2012 | Wu | G06F 1/182 |
| | | | | 361/679.47 |
| 2015/0017905 | A1* | 1/2015 | Li | G06F 1/203 |
| | | | | 454/184 |
| 2015/0195952 | A1* | 7/2015 | Tsunoda | G06F 1/203 |
| | | | | 361/690 |

FOREIGN PATENT DOCUMENTS

| | | |
|---|---|---|
| JP | 2002-190685 A | 7/2002 |
| JP | 2004-119844 A | 4/2004 |
| JP | 2015-26670 A | 2/2015 |
| JP | 2015-130440 A | 7/2015 |
| JP | 2017-188570 A | 10/2017 |
| JP | 2019-113227 A | 7/2019 |
| JP | 2020-8719 A | 1/2020 |
| JP | 2021-39980 A | 3/2021 |
| WO | WO 01/81224 A1 | 11/2001 |

OTHER PUBLICATIONS

C3 Japanese-language Office Action issued in Japanese Application No. 2022-518607 dated Nov. 21, 2023 with English translation (17 pages).
International Search Report (PCT/ISA/210) issued in PCT Application No. PCT/JP2021/003650 dated Jun. 8, 2021 with English translation (five (5) pages).
Japanese-language Written Opinion (PCT/ISA/237) issued in PCT Application No. PCT/JP2021/003650 dated Jun. 8, 2021 (four (4) pages).

* cited by examiner

FIG. 6
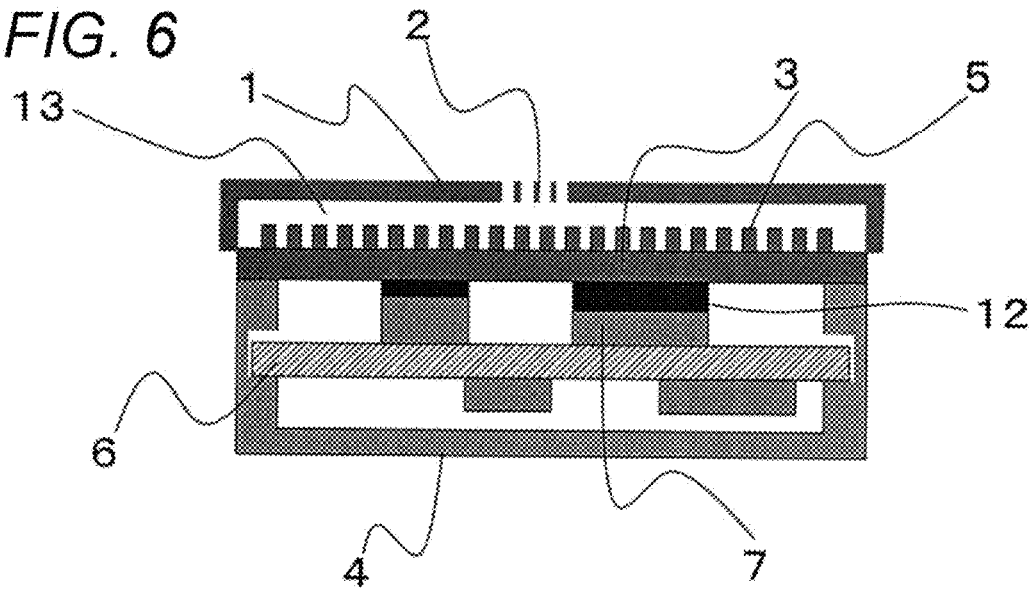
FIG. 7
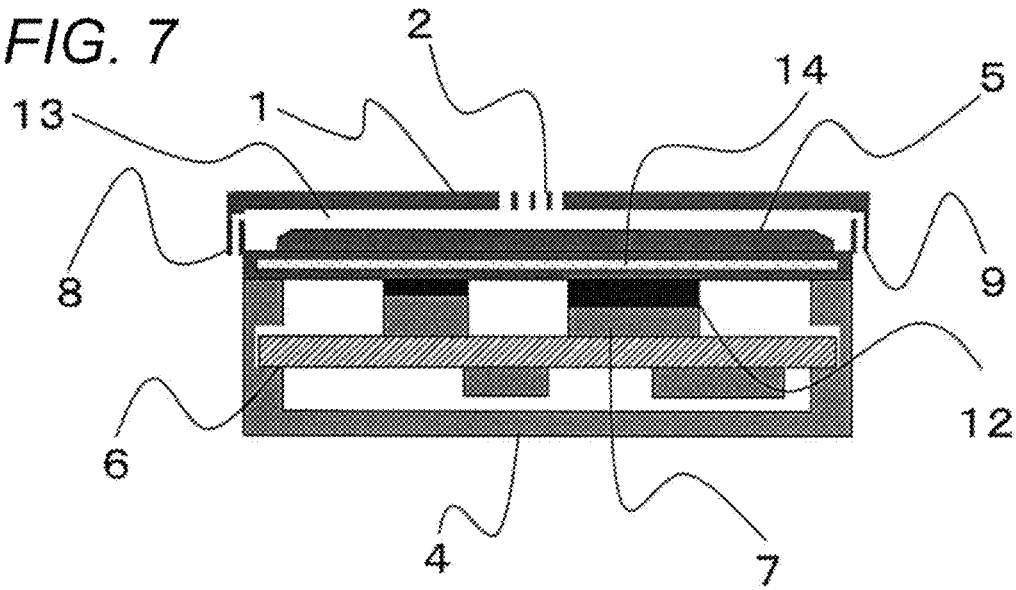
FIG. 8
| HEAT-GENERATING COMPONENT | | HEATING ELEMENT JUNCTION PORTION TEMPERATURE BY COOLING SYSTEM | | |
|---|---|---|---|---|
| TYPE | MAXIMUM RATED TEMPERATURE | (i) FIN-INTEGRATED VAPOR CHAMBER HOUSING | (ii) FIN-INTEGRATED HOUSING + FORCIBLE AIR COOLING (FAN) | (iii) STRUCTURE OF PRESENT INVENTION FIN-INTEGRATED VAPOR CHAMBER HOUSING + COVER WITH HOLE |
| A | 150°C | 140.32°C | 129.44°C | 134.58°C |
| B | 125°C | 129.44°C | 112.15°C | 122.57°C |
| C | 150°C | 141.65°C | 132.4°C | 125.37°C |

ELECTRONIC CONTROL DEVICE

TECHNICAL FIELD

The present invention relates to an electronic control device.

BACKGROUND ART

As a cooling method of an electronic control device equipped with a high-heat-generating component, for example, a method using an electric fan or electrically circulating cooling water is known (see, for example, PTL 1).

PTL 1 describes a cooling system in which a vapor chamber and water cooling are used together in an electronic control device. The heatsink serves as a vapor chamber, on which a housing serving as a cover for passing cooling water is provided.

CITATION LIST

Patent Literature

PTL 1: JP 2019-113227 A

SUMMARY OF INVENTION

Technical Problem

In the technique disclosed in PTL 1, the electronic control device is cooled by water cooling. An object of the present invention is to provide an electronic control device capable of improving cooling performance by air cooling.

Solution to Problem

In order to achieve the above object, an electronic control device of the present invention includes: a board; a heating element mounted on the board; a thermally conductive material that is in contact with the heating element and conducts heat of the heating element; a housing that is in contact with the thermally conductive material and covers the board; and a cover that covers the housing, in which the cover has an intake hole and an exhaust hole, the exhaust hole is formed at a position close to the heating element relative to the intake hole, and the intake hole is formed at a position away from the heating element relative to the exhaust hole.

Advantageous Effects of Invention

According to the present invention, cooling performance by air cooling can be improved. Problems, configurations, and effects other than those described above will be made clear by the description of the following embodiments.

BRIEF DESCRIPTION OF DRAWINGS

FIG. 6 is a schematic view of a cross-sectional view of the electronic control device according to the first embodiment of the present invention.

FIG. 7 is a schematic view of a cross section of an electronic control device according to a second embodiment of the present invention.

FIG. 8 is a table of a thermal fluid analysis result presenting effects of the electronic control control device according to the second embodiment of the present invention.

DESCRIPTION OF EMBODIMENTS

Figure 1:
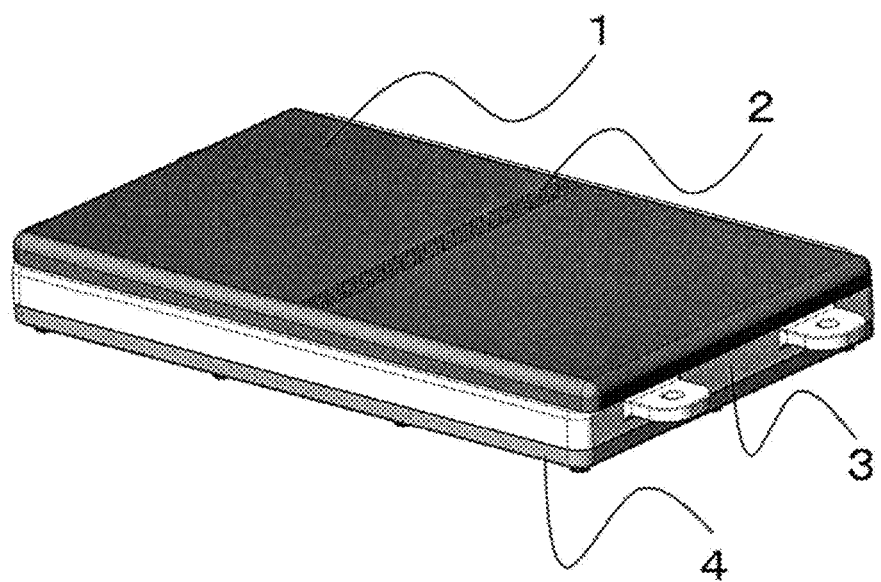
FIG. 1 is an overall view illustrating an electronic control device according to a first embodiment of the present invention.

Hereinafter, the configuration of the electronic control device according to the first to seventh embodiments of the present invention will be described with reference to the drawings. In the drawings, the same reference numerals denote the same parts. An object of these embodiments is to provide a cooling system that expands a region where heat of a heat-generating component can be dissipated by natural convection without using power, in addition to the object of the invention described above.

First Embodiment

Hereinafter, the first embodiment of the present invention will be described with reference to FIGS. 1 to 6.

Figure 2:
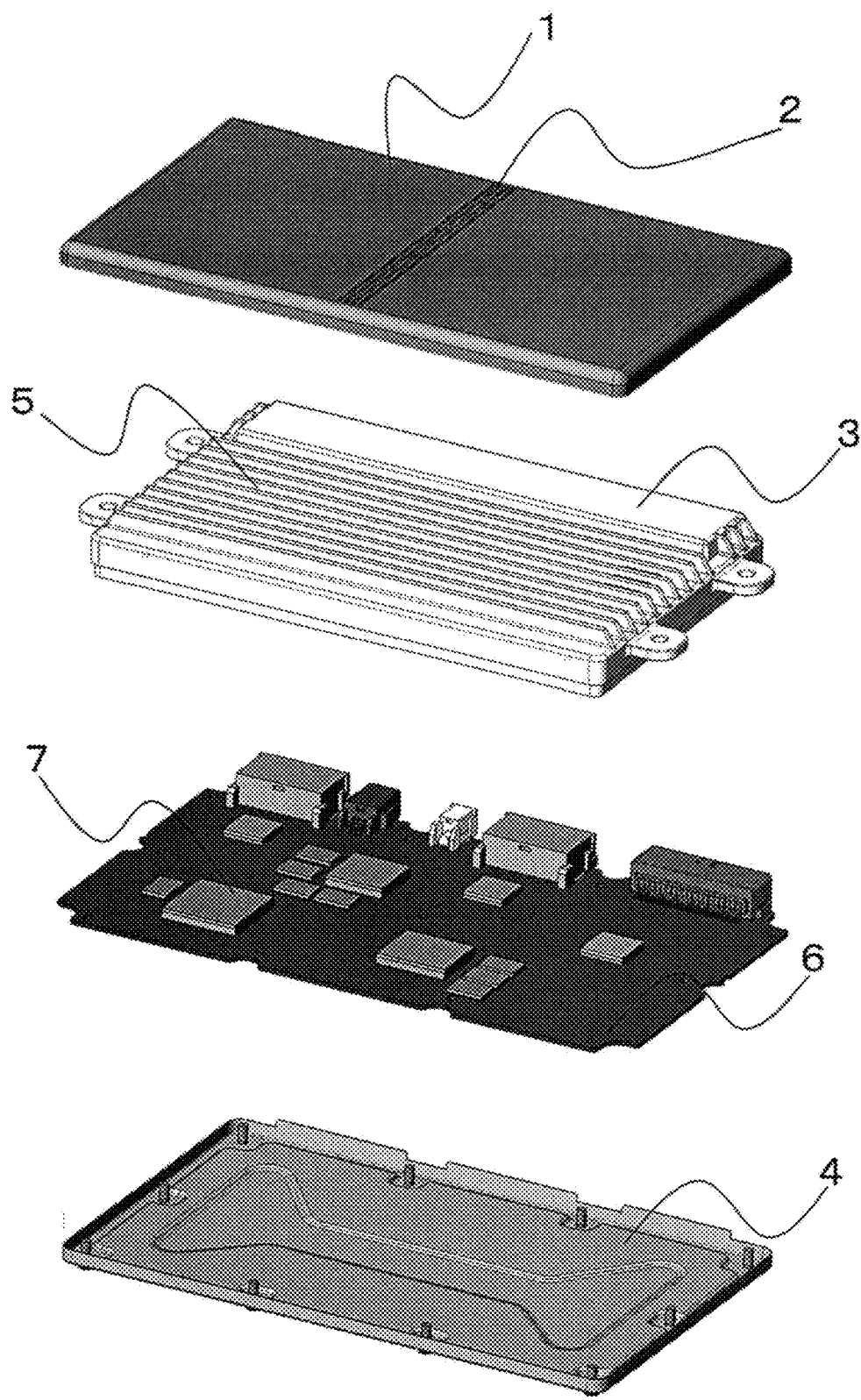
FIG. 2 is an exploded view of the electronic control device according to the first embodiment of the present invention.

FIG. 1 is an overall view illustrating the electronic control device according to the first embodiment of the present invention. FIG. 2 is an exploded view of the electronic control device of the present invention illustrated in FIG. 1. The device includes a cover 1, a fin-integrated housing 3, a circuit board 6 equipped with a plurality of electronic components, and a housing case 4.

The fin-integrated housing 3 is covered with the cover 1 so as to cover the surface formed with a fin.

Figure 3:
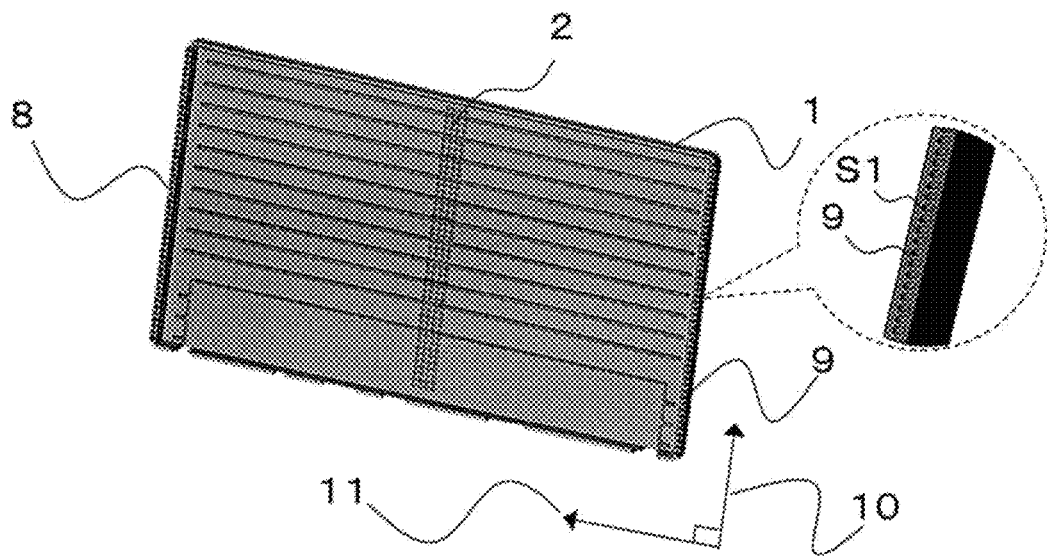
FIG. 3 is a schematic view of a cover of the electronic control device according to the first embodiment of the present invention.
Figure 4A:
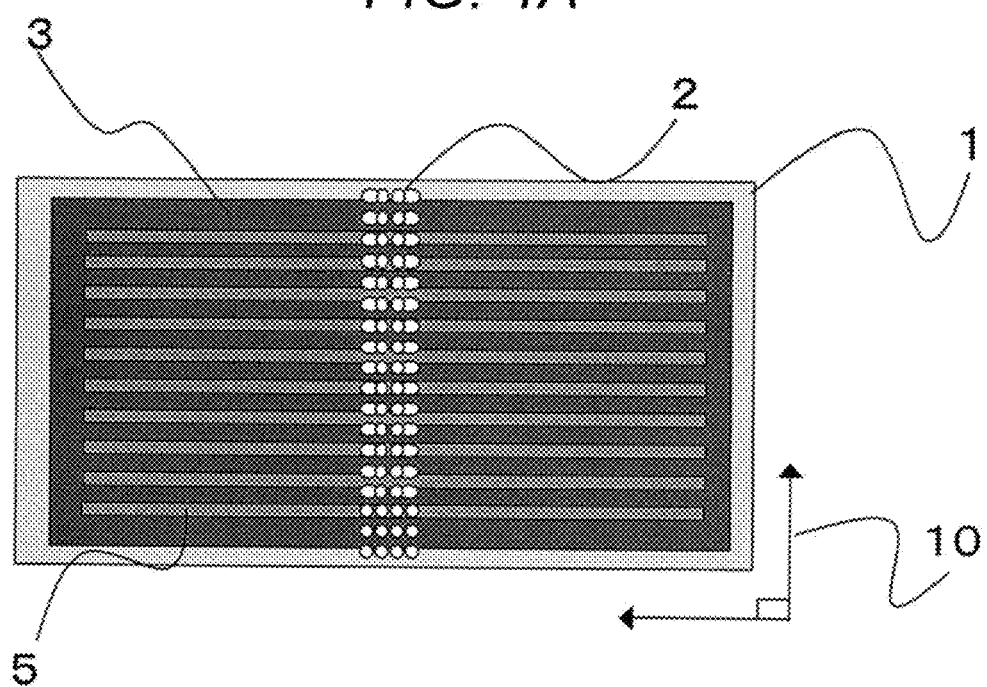
FIG. 4A is a top view of the electronic control device according to the first embodiment of the present invention.

The cover 1 is provided with a hole 2 in a top surface (a surface parallel to the surface formed with the fin of the fin-integrated housing 3). FIG. 3 illustrates the back side (the side opposing the fin-integrated housing) of the cover 1 with hole, and FIG. 4A is a top view of the electronic control device with the cover 1 being transmitted.

The cover 1 is formed with a hole (1) 2, a hole (2) 8, and a hole (3) 9. The position where the hole (2) 8 and the hole (3) 9 are formed is the side surface of the cover 1 on a side 10 perpendicular to the extending direction (the long direction of the fin-integrated housing 3 illustrated in FIG. 4A) of the fin of the fin-integrated housing opposing the cover 1. The cover 1 is made of, for example, aluminum, and the holes (1) 2, (2) 8, and (3) 9 are formed by, for example, laser processing or the like.

Next, a phenomenon caused by the above configuration will be described with reference to cross-sectional views.

Figure 5:
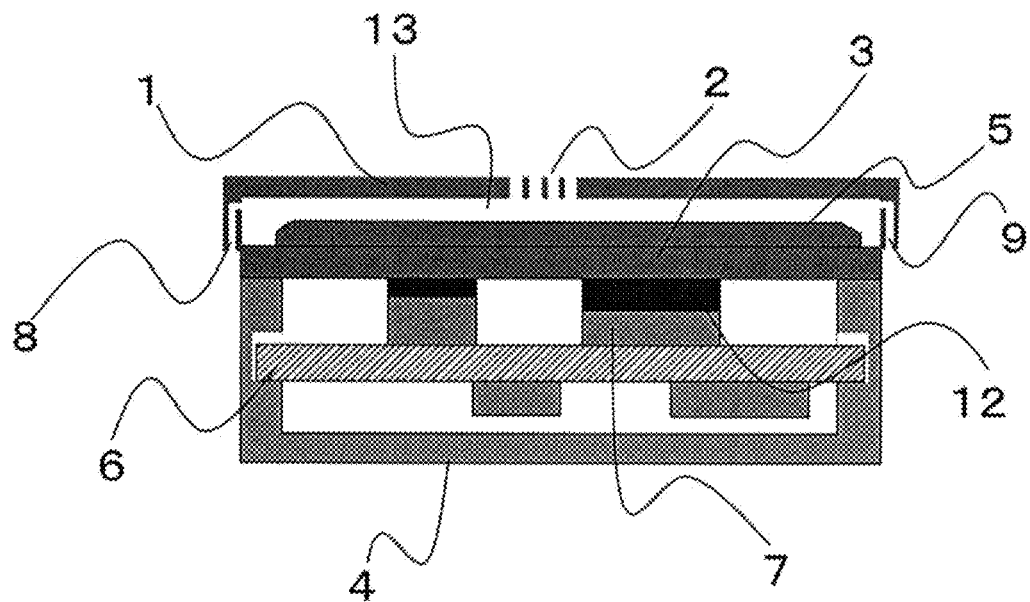
FIG. 5 is a schematic view of a cross-sectional view of the electronic control device according to the first embodiment of the present invention.

FIG. 5 is a schematic view of a cross section parallel to the extending direction of the fin regarding the electronic control device of the present invention. FIG. 6 is a schematic view of a cross section perpendicular to the extending direction of the fin. Heat of a heat-generating component 7 is dissipated to the fin-integrated housing 3 via a heat dissipation material 12.

While details will be described later, as illustrated in FIG. 5, the electronic control device includes at least the circuit board 6 (board), the heat-generating component 7 (heating element) mounted on the circuit board 6, the heat dissipation material 12 (thermally conductive material) that is in contact with the heat-generating component 7 and conducts heat of the heat-generating component 7, the fin-integrated housing 3 (housing) that is in contact with the heat dissipation material 12 and covers the circuit board 6, and the cover 1 that covers the fin-integrated housing 3. The cover 1 has the hole (2) 8 and the hole (3) 9 as intake holes, and the hole (1) 2 as an exhaust hole. The hole (1) 2 is formed at a position close to the heat-generating component 7 (heating element) relative to the hole (2) 8 and the hole (3) 9.

The hole (2) 8 and the hole (3) 9 are formed at positions away from the heat-generating component 7 relative to the hole (1) 2.

Due to this, natural convection occurs in a space between the cover 1 and the fin-integrated housing 3 (housing). As a result, it is possible to improve the cooling performance of the electronic control device. Since the cover 1 (the same member) is formed with the intake holes (the hole (2) 8 and the hole (3) 9) and the exhaust hole (the hole (1) 2), it is possible to process the holes collectively, and it is possible to reduce the number of man-hours.

As illustrated in FIG. 6, a surface on the cover 1 side of the fin-integrated housing 3 (housing) is provided with a plurality of fins 5. This increases the surface area of the fin-integrated housing 3, and makes it possible to further improve the cooling performance.

As illustrated in FIG. 5, the hole (1) 2 as an exhaust hole is formed in a top surface portion of the cover 1 opposing the fin-integrated housing 3 (housing), and the hole (2) 8 and the hole (3) 9 as intake holes are formed in a side surface portion of the cover 1. The intake holes (the hole (2) 8 and the hole (3) 9) have L shapes. As illustrated in FIG. 3, the inlet of the intake hole (for example, the hole (3) 9) is positioned on a tip end surface S1 of the side surface portion of the cover 1.

This makes it easy to cause a temperature difference between the intake hole and the exhaust port.

The heat dissipation material 12 illustrated in FIGS. 5 and 6 preferably has as high thermal conductivity as possible. However, on the other hand, when the thermal conductivity increases, the heat dissipation material 12 becomes a hard material in most cases, which affects reliability of a junction portion between the heat-generating component 7 and the circuit board. The heat dissipation material 12 selected here is preferably a material having hardness to a level that does not affect the reliability of the junction portion between the heat-generating component 7 and the circuit board.

Heat of the heated fin-integrated housing 3 causes heat transfer to air 13 between the fin-integrated housing 3 and the cover 1. The density of the air 13 decreases by being heated. As a result, the heated air 13 flows out from the hole (1) 2 of the cover 1 to low-temperature outside air. When the outflow of the air 13 to the outside air occurs, the outside cold air is instead sucked in from the holes (2) 8 and (3) 9. The holes (2) 8 and (3) 9 serving as suction ports are sufficiently small with respect to the environment outside the housing.

Therefore, according to Bernoulli's principle, in the vicinity of the inlets of the holes (2) 8 and (3) 9, the pressure decreases and the flow velocity of the air increases. Bernoulli's principle is the law of conservation of energy regarding a fluid expressed by [pressure+(weight of fluid)/ (gravitational acceleration×2)×flow velocity 2=constant].

Cool air sucked from the holes (2) 8 and (3) 9 passes through the respective holes and then flows between the cover 1 and the fin-integrated housing 3 along the fins 5. Then, the air is heated again by the heat of the heat-generating component 7 and discharged from the hole (1) 2. The air convection is generated between the cover 1 and the fin-integrated housing 3 by a series of air flows of the exhaust from the hole (1) 2 and the intake from the hole (2) 8 and the hole (3) 9. During discharge from hole (1) 2, cool air is constantly sucked from the holes (2) 8 and (3) 9.

Here, a conventional electronic control device will be described. Conventionally, the cover 1 does not exist, and the electronic control device includes a fin-integrated housing, a circuit board equipped with an electronic component, and a housing case. The heat of the heat-generating component is dissipated to the fin-integrated housing via a heat dissipation material serving as an intermediate member. Furthermore, the heat dissipated to the fin-integrated housing is spread in the in-plane direction of the housing along the fin. However, the heat spread in the housing is at most about 1 to 2.5 times the contact area with the heat-generating component. It is difficult to spread the heat to the end portion of the housing, and there is a case where it becomes difficult to lower the junction portion temperature of the heat-generating component to equal to or less than the maximum rated temperature. Therefore, for example, forcible air cooling by a fan is used. The housing surface is cooled by using an electric fan. This makes it possible to increase the amount of heat dissipated from the heat-generating component to the housing via the heat dissipation material, and to lower the junction portion temperature of the heat-generating component.

However, the fan has problems in terms of cost, size, quietness, and reliability. For example, in an electronic control device installed in a vehicle interior, quietness is an important examination item. No matter how small it is, the motor sound of the fan and the sound of rotation of the propeller can be heard as noise to the human ear. The fan has a life. In general, the life of the fan is 5 to 6 years.

Abnormal noise starts to occur at a stage earlier than that. For this reason, it is not easy to use the fan in an in-vehicle product, and it is necessary to be extremely careful when using one.

According to the present embodiment, the holes (1) 2, (2) 8, and (3) 9 provided in the cover 1 cause convection of the air 13 in the space between the fin-integrated housing 3 and the cover 1, and the surface of the fin-integrated housing 3 can be cooled. While the temperature of the air 13 heated by the fin-integrated housing 3 is higher than the outside air temperature of the cover 1, natural convection is continuously caused between the fin-integrated housing 3 and the cover 1.

Therefore, the heat dissipated from the heating element to the fin-integrated housing 3 via the heat dissipation material 12 is cooled by the convection of the air 13, and the junction portion temperature of the heating element will not continue to rise. That is, the presence of the holes of the cover 1 achieves a cooling system that does not require power. As a result, it is possible to achieve an electronic control device that does not require power consumption used for cooling, is small in size, and can incorporate a high-heat-generating component. Furthermore, since the cover with hole can be made at low cost as compared with an expensive in-vehicle fan, provision of an electronic control device having a low-cost cooling system is achieved.

Figure 4B:
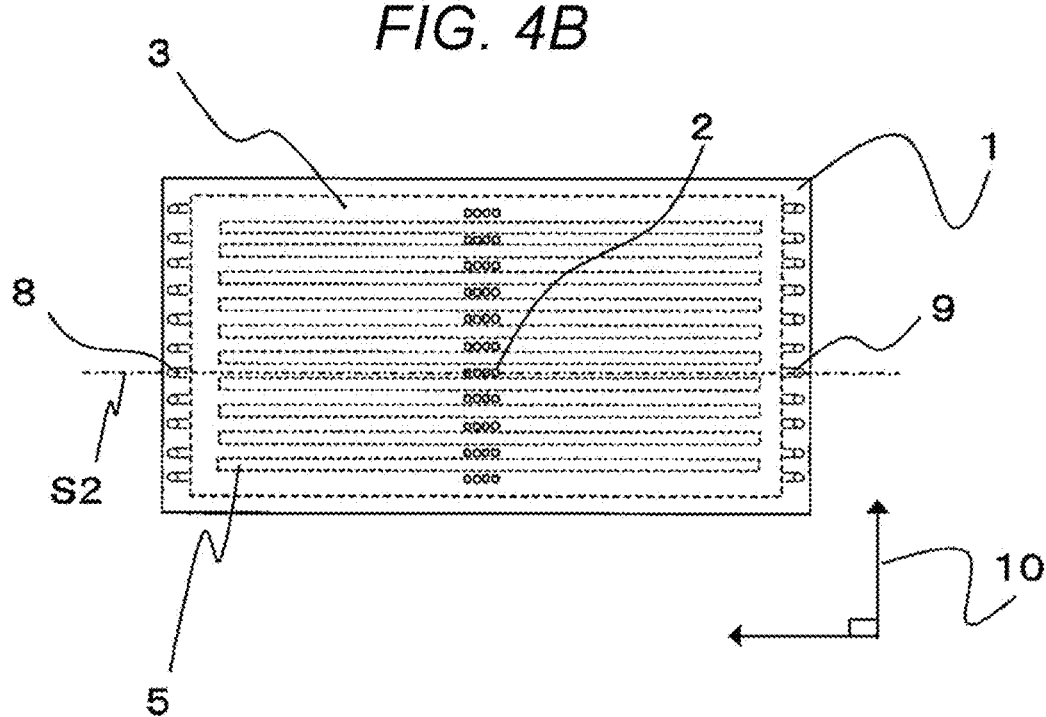
FIG. 4B is a top view of an electronic control device according to a modification of the first embodiment of the present invention.

In the present embodiment, the fins 5 have plate shapes. As illustrated in FIG. 4B, the hole (2) as an exhaust hole and the holes (2) 8 and (3) 9 as intake holes are formed at positions along a groove between adjacent fins 5. Specifically, the exhaust hole is positioned above the groove between the adjacent fins 5, and the center lines of the intake holes and the exhaust hole are included in one plane S2. This improves the flow of air from the intake hole to the exhaust hole. The fins 5 are provided along the long direction of the fin-integrated housing 3 (housing). Due to this, the fins 5 are cooled by the air supplied from the intake holes (the hole (2) 8 and the hole (3) 9) away from the heat-generating component 7 (heating element).

Second Embodiment

FIG. 7 is a schematic view of a cross section of the electronic control device of the second embodiment of the present invention. A vapor chamber is formed in the fin-integrated housing in the first embodiment of FIGS. 1 to 6 to form a fin-integrated vapor chamber 14. In other words, the fin-integrated housing (housing) has a vapor chamber.

The vapor chamber is a heatsink in which a hydraulic fluid is sealed, and the hydraulic fluid repeats a phase change between a liquid and a gas due to a minute in-plane temperature difference, and diffuses heat in a wide range.

The high performance of the vapor chamber is already well known, and, for example, evaluation with an index of thermal conductivity indicates that the vapor chamber has an ability of thermal conduction that is two digits higher than that of copper or aluminum. This makes it possible to lower the junction portion temperature of the heating element at once, and it has been adopted as a heatsink material for equal to or greater than ten years in personal computers, smartphones, and the like.

There are a plurality of materials of the vapor chamber housing, such as aluminum, copper, stainless steel, and resin. The housing has a basic structure in which outer circumferences of two superposed plates are joined and a hydraulic fluid is injected into a space between the plates. As the hydraulic fluid, for example, water, alcohol, or the like is used. The hydraulic fluid is to be changed depending on the material of the housing.

As a manufacturing method of the vapor chamber housing, when the housing is made of aluminum, for example, two plates are produced by casting (die casting) using a mold. Alternatively, it is produced by pressing, and it is also possible to produce the fin portion by extrusion.

One of the problems in the case of in-vehicle use is the strength of the vapor chamber housing itself. In order to make a device capable of withstanding a difference in atmospheric pressure or a difference in temperature, the vapor chamber housing needs to have a certain thickness. Alternatively, it is also possible to maintain the strength by providing a column for reinforcement in a space inside the vapor chamber. The strength of the junction portion between the two plates of the vapor chamber is also one of the problems. When the junction strength is low, the internal hydraulic fluid leaks and does no longer perform the function. Therefore, for example, high-strength junction is obtained by brazing, laser welding, friction stir welding, or the like.

Here, characteristics that become problems of the vapor chamber will be described. One of the important things for maintaining the high thermal diffusion capability of the vapor chamber is to keep ensuring a temperature difference, even if it is very small, in the in-plane direction of the vapor chamber. In the case of a control device equipped with a high-heat-generating component, when heat exceeding the maximum heat capacity to the vapor chamber flows into the vapor chamber, the temperature of the entire vapor chamber becomes uniform.

Since the vapor chamber diffuses heat by a phase change of the hydraulic fluid due to a very small temperature difference, heat transport capacity decreases if there is no temperature difference. Therefore, an electronic control device having an extremely high heating value sometimes uses a vapor chamber and power such as an electric fan for dissipating heat of the vapor chamber in combination. However, as described above, since use of the fan has problems such as quietness and mechanical reliability, there is a case where the fan cannot be used.

According to the present embodiment, since the vapor chamber is incorporated into the fin-integrated housing to form the fin-integrated vapor chamber 14, and covered with the cover with hole, a high cooling system that does not require power and that exerts the performance of the vapor chamber is achieved.

FIG. 8 is a thermal fluid analysis result performed for three patterns of cooling systems in order to confirm the effect of the vapor chamber on heat generation of the heat-generating component. The three patterns are (i) a case where the housing serving as the heatsink is a fin-integrated vapor chamber, (ii) a case where a fan is used in combination with a normal fin-integrated housing, and (iii) a case where a cover with hole is used in combination with the fin-integrated vapor chamber that is the structure of the present invention.

(i) In the case of the vapor chamber housing with fin, it is not possible to suppress the junction portion temperature of a heat-generating component B to equal to or less than the maximum rated temperature. On the other hand, the cooling effect of (ii) the normal fin-integrated housing+fan is so high that it is possible to sufficiently reduce the junction portion temperature of the heat-generating component B with respect to the maximum rated temperature. In the case of (iii) the fin-integrated vapor chamber housing+the cover with hole that is the structure of the present invention, it become possible to suppress the junction portion temperature of all the heat-generating components to equal to or less than the maximum rated temperature, although it is not as much as the case of (ii) the use of the fan in combination. This is because of the use of the vapor chamber having high thermal conductivity and the cover with hole in combination.

According to an embodiment of the present invention, a high cooling system is achieved by use of the fin-integrated vapor chamber and the cover with hole in combination.

The heat transferred from the heat-generating component 7 to the fin-integrated vapor chamber via the heat dissipation material 12 is spread over a wide range in the in-plane direction of the vapor chamber. The wide range is the entire fin-integrated vapor chamber 14. Since the thermal conductivity area greatly expands as compared with a normal fin-integrated housing, the amount of heat dissipation from the heat-generating component 7 greatly increases.

Furthermore, the surface of the fin-integrated vapor chamber is cooled by convection of air generated between the cover 1 and the fin-integrated vapor chamber by the hole of the cover 1. This causes a temperature difference in the in-plane direction of the vapor chamber, and makes it possible to maintain the thermal diffusion capability of the vapor chamber. As a result, it becomes possible to increase the amount of heat dissipation from the heat-generating component 7, and to significantly lower the junction portion temperature of the heat-generating component 7. That is, it becomes possible to provide an electronic control device having a cooling system with a higher level than that of the electronic control device of the first embodiment.

As a result, the phase change of the hydraulic fluid in the vapor chamber is facilitated by natural convection of the air between the cover 1 and the fin-integrated vapor chamber 14, whereby the cooling performance can be further improved while the quietness of the electronic control device is ensured.

In the fin-integrated vapor chamber 14, since the fin-integrated housing and the vapor chamber are integrated, the cooling performance is improved by a synergistic effect of the fin and the vapor chamber. The number of components can be reduced.

Third Embodiment

Figure 9:
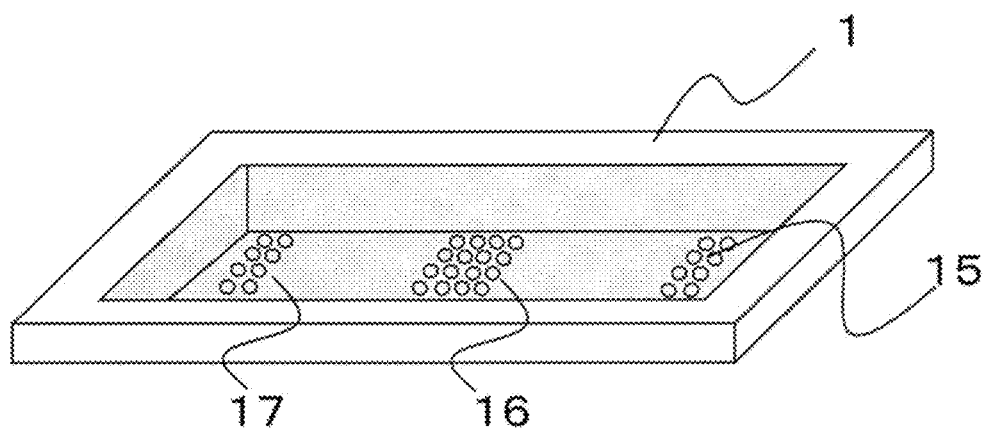
FIG. 9 is a bottom view of a cover of an electronic control device according to a third embodiment of the present invention.

A plurality of positions of the hole of the cover 1 can be considered. FIG. 9 is a schematic view of the back side (the side opposing the fin-integrated housing) of the cover where the position of the hole is different from those in the first and second embodiments. In the present embodiment, an identical surface (here, the top surface) of the cover 1 is formed with a hole (15, 16, or 17) for exhaust and a hole (15, 16, or 17) for intake. A hole provided at a position closer to a heat source becomes an exhaust hole, and a hole provided at a position farther from the heat source becomes an intake hole.

In the present embodiment, the exhaust hole and the intake hole are formed in parallel to or at an angle with respect to the thickness direction of the cover 1. The intake hole is formed in the top surface portion of the cover 1. This makes it easy to process the exhaust hole and the intake hole, for example.

Between the cover 1 and the fin-integrated housing 3, the warmed air 13 flows out from the exhaust hole and ascends to an upper portion (space) away from the top surface of the cover 1 by updraft. Instead, cold air is pushed out from the upper portion away from the top surface of the cover 1 and flows in through the intake hole formed on the top surface of the cover 1. This series of cycles results in natural convection of the air 13. Here, the air convection efficiently hits the housing surface positioned immediately above the heat-generating component when the exhaust hole is in a shifted position rather than immediately above the heat-generating component serving as the heat source, and the cooling effect can be improved.

According to the present embodiment, even when it is impossible to take in outside air from the lower surface and the side surface of the electronic control device, it is possible to exhaust and intake air using only the top surface of the cover 1. This makes it possible to provide an electronic control device with no restriction on installation.

Fourth Embodiment

Figure 10:
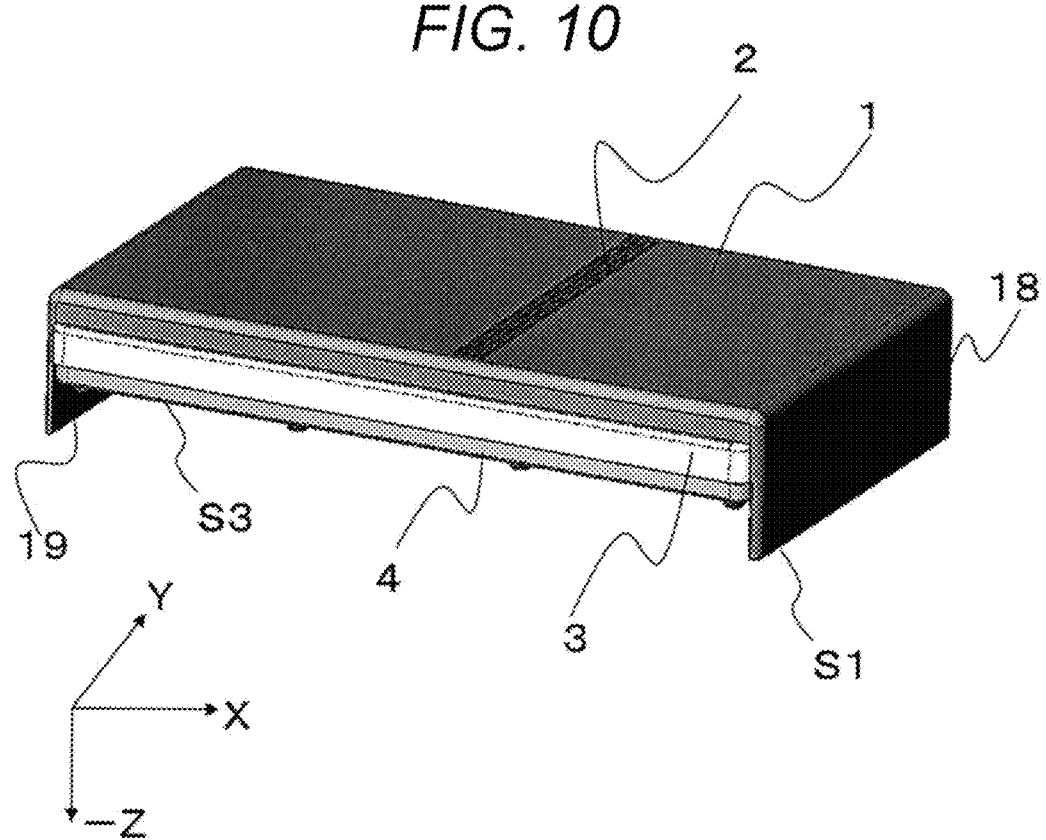
FIG. 10 is an overall view illustrating an electronic control device according to a fourth embodiment of the present invention.
Figure 11:
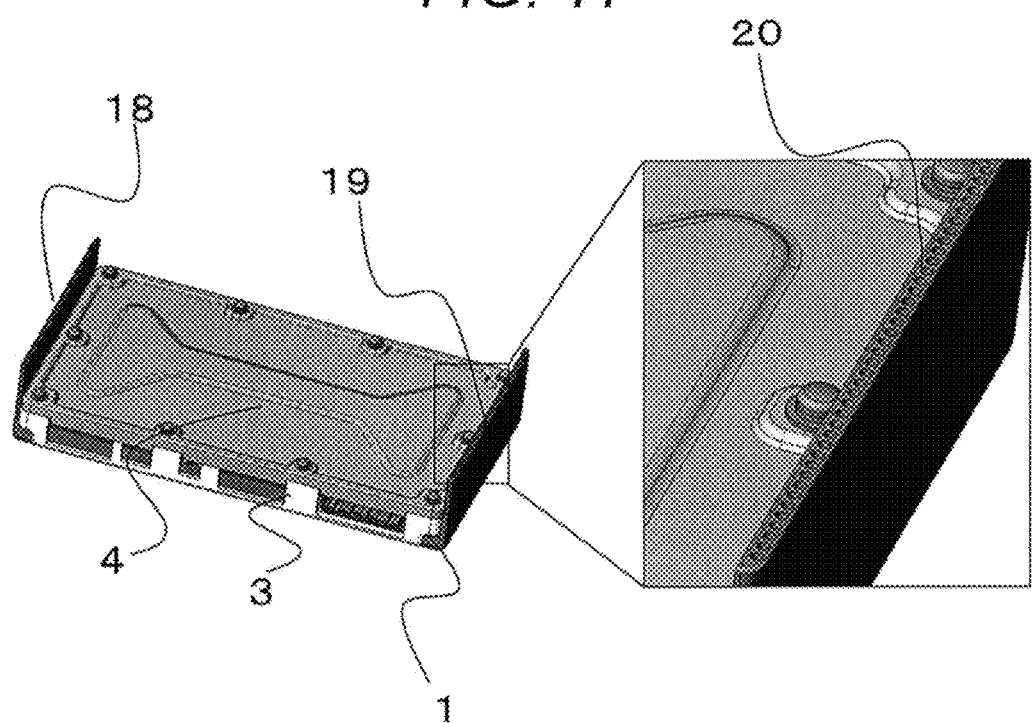
FIG. 11 is a bottom view of the electronic control device according to the fourth embodiment of the present invention and an enlarged view of an intake hole of a cover.

FIG. 10 is a schematic view of an electronic control device presenting the fourth embodiment of the present invention. It has a structure in which lengths of surfaces 18 and 19 perpendicular to the extending direction of the fin of the fin-integrated housing 3 are elongated in the −Z direction. FIG. 11 is a schematic view of the electronic control device of FIG. 10 as viewed from the back side, and an enlarged view of a tip end portion of the surface 19. A plurality of holes serving as intake holes are formed inside each of the surface 18 and the surface 19.

As illustrated in FIG. 10, the electronic control device includes the housing case 4 fitted to the fin-integrated housing 3 (housing), and a tip end surface of the side surface portion of the cover 1 is away from the top surface portion of the cover 1 relative to a bottom surface S3 of the housing case 4.

According to the present embodiment, air having a lower temperature can be sucked by extending the inlet of the intake hole and taking the inlet away from the housing. Since the temperature difference of the air between the intake hole and the exhaust hole is increased, the pressure difference increases. In accordance with the law of conservation of energy, a difference in air flow velocity also increases and the speed of convection increases. As a result, it is possible to provide an electronic control device having a high cooling effect.

Fifth Embodiment

Figure 12:
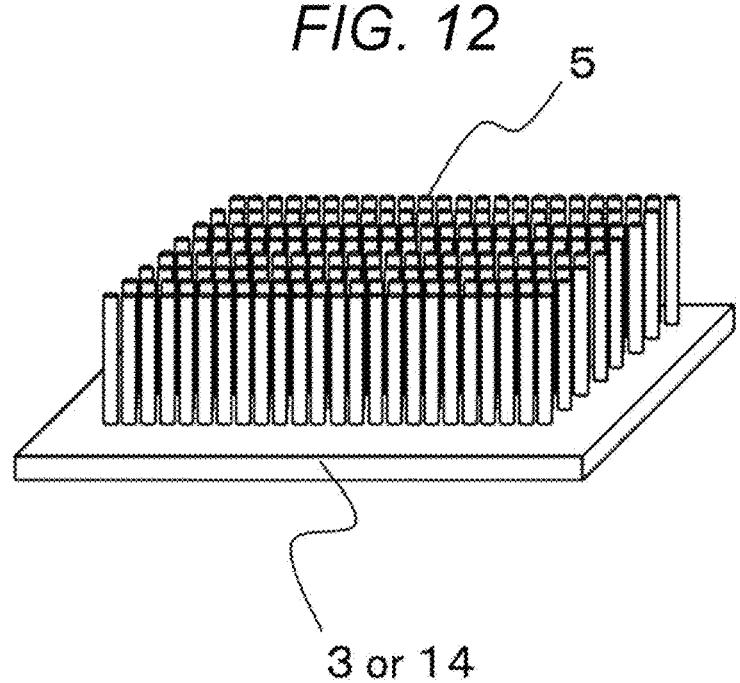
FIG. 12 is a schematic view of a housing of an electronic control device according to a fifth embodiment of the present invention.

It is possible to conceive of the shape of the fin of the fin-integrated housing 3 or the fin-integrated vapor chamber 14 other than a shape extending in a predetermined direction of a surface parallel to the cover. As illustrated in FIG. 12, for example, a pin-shaped fin extending in the vertical direction with respect to the upper surface of the housing may be used. That is, the fin may have a columnar shape. This makes it possible to further increase the surface area and to further improve the cooling performance. The shape of the pin is not limited to a cylinder or a prism, and various shapes can be adopted.

According to the present embodiment, in the case of the pin-shaped fin, the area of the fin hit by the wind generated by the natural convection of the air increases. As a result, it is possible to provide an electronic control device having an improved heat dissipation effect.

Sixth Embodiment

Figure 13:
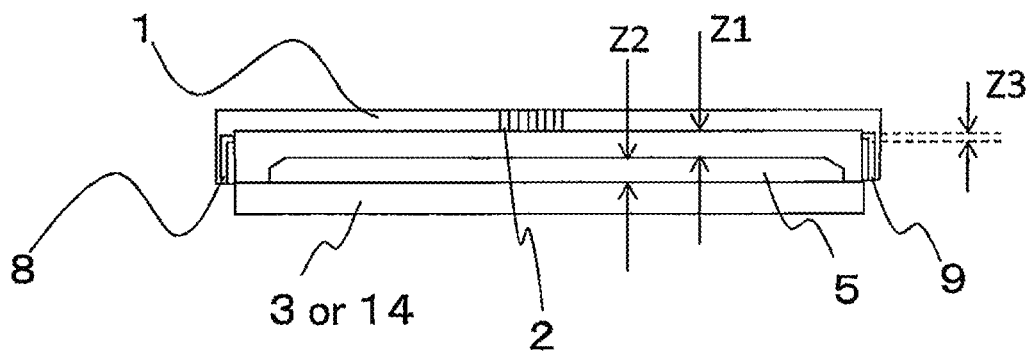
FIG. 13 is a schematic view illustrating various dimensions around a cover of an electronic control device according to a sixth embodiment of the present invention.

It is difficult to improve the cooling effect of the exhaust hole and the intake hole formed in the cover 1 if their hole diameters are too small or too large. As illustrated in FIG. 13, when the diameter of a hole formed in the cover 1 is $Z3$, the distance between the cover and the fin is $Z1$, and the height of the fin is $Z2$, it is desirable that the relationship of $Z3 \leq Z1+Z2$ be satisfied, and $0 < Z3 \leq Z1+Z2$ be further satisfied. That is, the diameter of the hole is formed to be sufficiently smaller than the space outside the hole.

In other words, as illustrated in FIG. 13, at least when the diameters of the holes (2) 8 and (3) 9 as the intake holes are Z3, the distance between the cover 1 and the fins 5 is Z1, and the heights of the fins 5 is Z2, the relationship of Z3≤Z1+Z2 is satisfied. It is preferable to satisfy the relationship of 0<Z3≤Z1+Z2.

As a result, according to Bernoulli's principle, it becomes possible to increase the flow velocity in the vicinity of the inlet/outlet of the hole, and the natural convection of the air 13 actively occurs. As a result, it becomes possible to improve the cooling effect by the natural convection.

Seventh Embodiment

Figure 14:
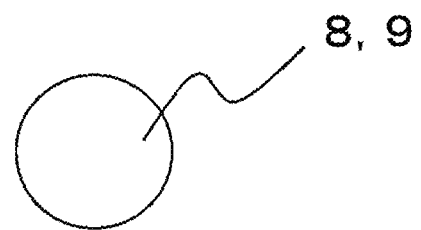
FIG. 14 is a cross-sectional view of a hole of a cover of an electronic control device according to a seventh embodiment of the present invention.
Figure 14:
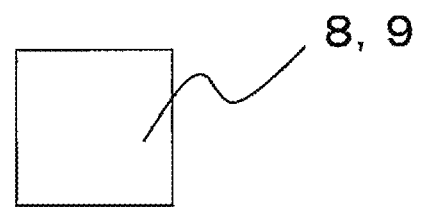
Figure 14:
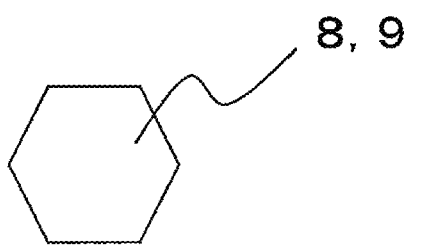

The shape of the hole formed in the cover 1 is desirably a shape having a circle or a corner as illustrated in FIG. 14. In other words, the shapes of the cross sections of the hole (1) 2 as the exhaust hole and the holes (2) 8 and (3) 9 as the intake holes are circular or polygonal.

For example, in the case of a circular shape, it is possible to provide an electronic control device that maintains quietness free from a concern of generation of sound when air passes through the hole.

On the other hand, in the case where the shape of the hole is a shape having a corner, convection of air after passing through the hole becomes a turbulent flow. In turbulent flow of the natural convection, the Reynolds number, which represents the viscosity of the fluid, increases. The Reynolds number of the turbulent flow has a proportional relationship to the Nusselt number, which represents the characteristics of the fluid. The Nusselt number is a ratio between the heat transfer coefficient and the thermal conductivity of a fluid, and is proportional to the heat transfer coefficient. Therefore, when the natural convection increases in the Reynolds number and becomes a turbulent flow, the heat transfer coefficient of the fluid increases. As a result, the heat transfer amount of the heat of the surface of the fin-integrated housing 3 or the fin-integrated vapor chamber 14 to the air increases, and the cooling effect can be further improved.

The present invention is not limited to the above-described embodiments, and includes various modifications. For example, the embodiments described above have been described in detail for an easy-to-understand explanation of the present invention, and are not necessarily limited to those having all the described configurations. It is also possible to replace a part of the configuration of a certain embodiment with the configuration of another embodiment, and it is also possible to add the configuration of another embodiment to the configuration of the certain embodiment. Another configuration can be added to, deleted from, or replaced with a part of the configuration of each embodiment.

The embodiment of the present invention may have the following aspects.

(1). An electronic control device including: a heating element mounted on a board; a housing that is in thermal contact with the heating element via an intermediate member; and a cover so as to cover the housing, in which the cover has an intake hole and an exhaust hole formed on an upper surface or a side surface, the exhaust hole is formed at a position closer to a heat source, and the intake hole is formed at a position away from a heat source.

(2). The electronic control device according to (1), in which the housing includes a fin integrally on a surface opposing the cover to form a fin-integrated housing.

(3). The electronic control device according to (1), in which the housing includes a vapor chamber formed integrally with the fin.

(4). The electronic control device according to (1), (2), or (3), in which positions of the holes of the cover are formed on the upper surface and the side surface of the cover or only on the upper surface of the cover.

(5). The electronic control device according to (2) or (3), in which a fin shape of the fin-integrated housing is a shape extending in a predetermined direction parallel to the upper surface of the housing, and the holes of the cover are formed at two or more different positions on a same extension line of the fin.

(6). The electronic control device according to (2) or (3), in which a fin shape of the fin-integrated housing is a shape extending in a vertical direction with respect to the upper surface of the housing, and some or all of the holes of the cover are the electronic control device according to (2) or (3).

(7). The electronic control device according to (2) or (3), in which when a diameter of the hole formed in the cover is Z3, a distance between the cover and the fin is Z1, and a height of the fin is Z2, a relationship of Z3≤Z1+Z2 is satisfied.

(8). The electronic control device according to (2) or (3), in which the diameter Z3 of the hole of the cover is 0<Z3≤Z1+Z2.

(9). The electronic control device according to (1), (2), or (3), in which a shape of the holes of the cover is a shape having a circle or a corner.

(10). The electronic control device according to (1), (2), or (3), in which the holes of the cover are formed in parallel to or at an angle with respect to a thickness direction of the cover.

(11). The electronic control device according to (2) or (3), in which the holes of the cover are formed at a position not overlapping a protrusion of the fin in side view and top view.

According to (1) to (11), it is possible to provide high cooling performance by natural convection of air without using power such as circulating cooling water or an electric fan. The natural convection is generated by an intake hole and an exhaust hole formed in a cover provided so as to cover the housing. Therefore, the flow rate and the flow velocity can be designed in advance, and a highly reliable cooling system in which a change in cooling performance is extremely small during use is achieved. Since power is not used, problems such as failure and noise are solved, and further downsizing and cost reduction are achieved.

REFERENCE SIGNS LIST

1 cover
2 hole (1)
3 fin-integrated housing
4 housing case
5 fin
6 circuit board
7 heat-generating component
8 hole (2)
9 hole (3)
10 perpendicular to extending direction of fin
11 parallel to extending direction of fin
12 heat dissipation material
13 air
14 fin-integrated vapor chamber
15 hole (4)

16 hole (5)
17 hole (6)
18 surface (1) perpendicular to extending direction of fin of fin-integrated housing 3
19 surface (2) perpendicular to extending direction of fin of fin-integrated housing 3
20 hole (7)

The invention claimed is:

1. An electronic control device, comprising:
    a board;
    a heating element mounted on the board;
    a thermally conductive material that is in contact with the heating element and conducts heat of the heating element;
    a housing that is in contact with the thermally conductive material and covers the board; and
    a cover that covers the housing,
    wherein the cover has an intake hole and an exhaust hole,
    the exhaust hole is formed at a position close to the heating element relative to the intake hole, and
    the intake hole is formed at a position away from the heating element relative to the exhaust hole.

2. The electronic control device according to claim 1, wherein
    a surface on the cover side of the housing is provided with a plurality of fins.

3. The electronic control device according to claim 2, wherein
    the housing has
    a vapor chamber.

4. The electronic control device according to claim 2, wherein
    the exhaust hole is
    formed on a top surface portion of the cover opposing the housing, and
    the intake hole is
    formed on a side surface portion or the top surface portion of the cover.

5. The electronic control device according to claim 4, wherein
    the fins have plate shapes, and
    the exhaust hole and the intake hole are
    formed at positions along a groove between the fins that are adjacent.

6. The electronic control device according to claim 4, wherein
    the fins have columnar shapes.

7. The electronic control device according to claim 2, wherein
    when a diameter of the intake hole is Z3, a distance between the cover and the fins is Z1, and a height of the fins is Z2, a relationship of $Z3 \leq Z1+Z2$ is satisfied.

8. The electronic control device according to claim 2, wherein
    when a diameter of the intake hole is Z3, a distance between the cover and the fins is Z1, and a height of the fins is Z2, a relationship of $0<Z3 \leq Z1+Z2$ is satisfied.

9. The electronic control device according to claim 1, wherein
    shapes of cross sections of the exhaust hole and the intake hole are
    circular or polygonal.

10. The electronic control device according to claim 1, wherein
    the exhaust hole and the intake hole are
    formed in parallel to or at an angle with respect to a thickness direction of the cover.

11. The electronic control device according to claim 5, wherein
    the exhaust hole is
    positioned above a groove between the fins that are adjacent, and
    center lines of the intake hole and the exhaust hole are included in one plane.

12. The electronic control device according to claim 4, wherein
    the intake hole is
    formed on a side surface portion of the cover, and
    an inlet of the intake hole is
    positioned on a tip end surface of the side surface portion of the cover.

13. The electronic control device according to claim 5, wherein
    the intake hole is
    L-shaped.

14. The electronic control device according to claim 12 comprising:
    a housing case fitted to the housing,
    wherein the tip end surface of the side surface portion of the cover is
    away from a top surface portion of the cover relative to a bottom surface of the housing case.

15. The electronic control device according to claim 5, wherein
    the fin is
    provided along a long direction of the housing.

* * * * *